United States Patent [19]

Yamada

[11] 4,054,849
[45] Oct. 18, 1977

[54] SIGNAL COMPRESSION/EXPANSION APPARATUS

[75] Inventor: Takaaki Yamada, Atsugi, Japan

[73] Assignee: Sony Corporation, Tokyo, Japan

[21] Appl. No.: 701,565

[22] Filed: July 1, 1976

[30] Foreign Application Priority Data

July 3, 1975 Japan .................................. 50-82219
July 3, 1975 Japan .................................. 50-82220

[51] Int. Cl.² ........................................... H04B 1/64
[52] U.S. Cl. .................................... 333/14; 330/86; 330/278; 330/136; 330/145; 357/23
[58] Field of Search ............... 333/14; 330/29, 86, 330/133, 136, 145; 325/62; 179/1 P, 15 AV; 357/23

[56] References Cited

U.S. PATENT DOCUMENTS 3,829,883 8/1974 Bate ................................. 357/23
3,969,680 7/1976 Wermuth ........................ 333/14 X Primary Examiner—Paul L. Gensler
Attorney, Agent, or Firm—Lewis H. Eslinger; Alvin Sinderbrand

[57] ABSTRACT

Signal expansion/compression apparatus wherein an input signal is compressed by an exponential factor and then subsequently may be expanded by the reciprocal of that exponential factor, wherein neither the signal compression circuits nor the signal expansion circuits need be provided with exponential amplifiers or logarithmic function generators. The signal compressio circuit includes a plurality of serially-connected voltage controlled amplifiers, a first of such amplifiers receiving the input signal to be compressed and a predetermined one of such amplifiers providing the compressed output signal. A control signal generator is connected to the last of the voltage controlled amplifiers to produce a control voltage which is a function of the output signal of that last amplifier and a reference voltage. This control voltage is supplied to all of the voltage controlled amplifiers so as to determine the respective gains thereof. The signal expansion circuit includes a plurality of voltage controlled amplifiers, an input signal to be expanded being supplied in common to two of such amplifiers. An output of one of such amplifiers is combined with a reference signal to produce another control voltage which is supplied to all of the amplifiers in the signal expansion circuit so as to determine the respective gains thereof. The output signal produced by another amplifier is expanded with respect to the input signal. All of the voltage controlled amplifiers used in the compression and expansion circuits exhibit substantially linear gain characteristics and, preferably, are comprised of a voltage controlled impedance whose impedance value is linearly related to the applied control voltage.

27 Claims, 14 Drawing Figures

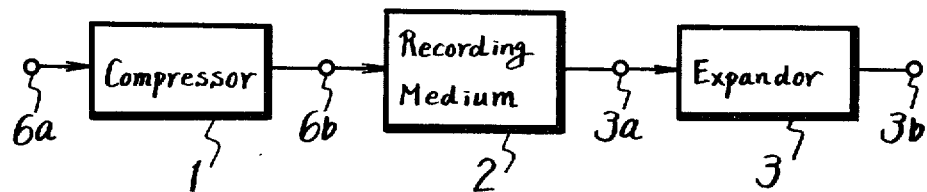
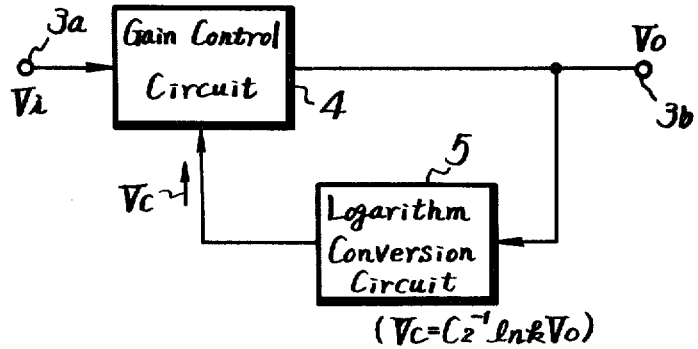
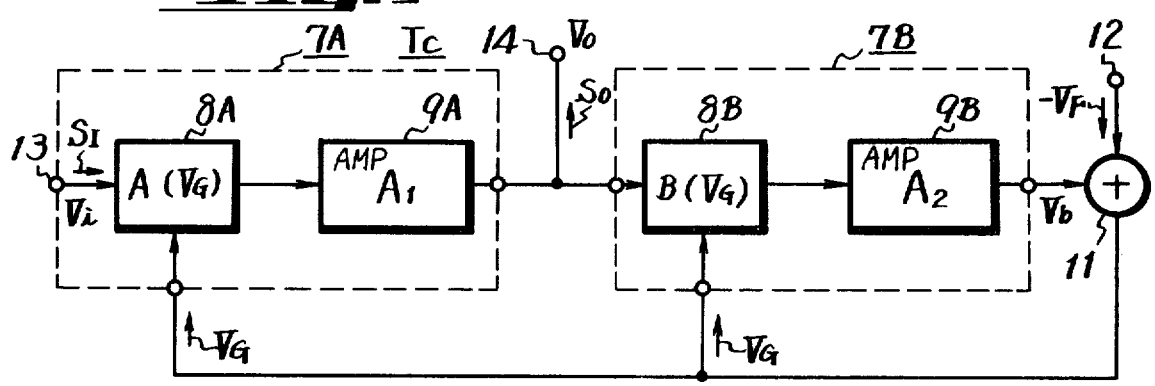

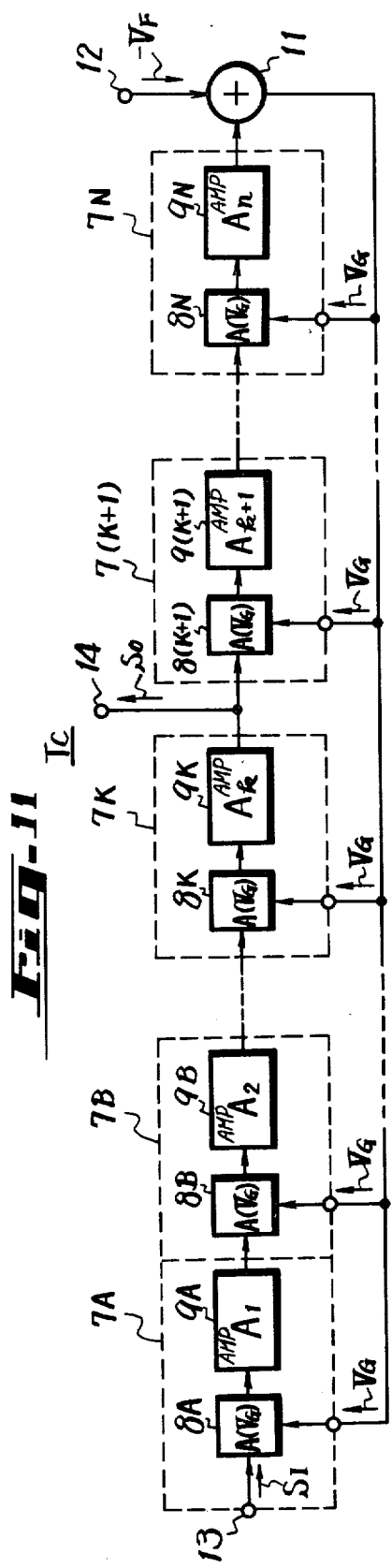
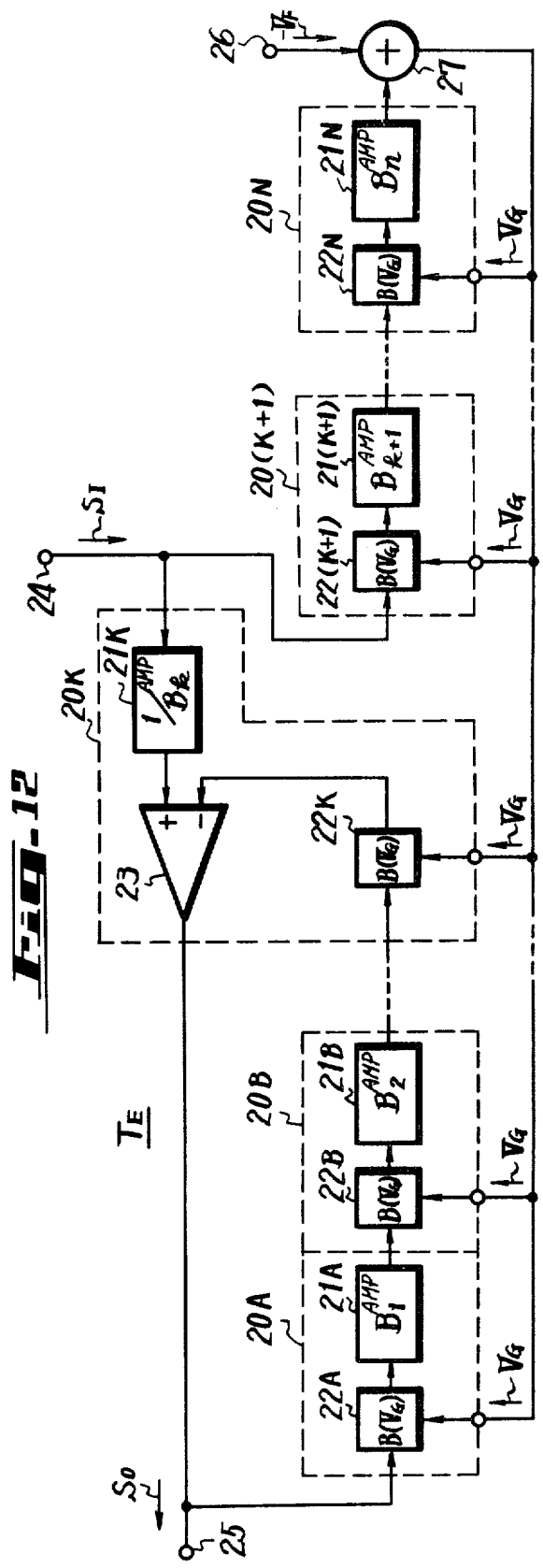

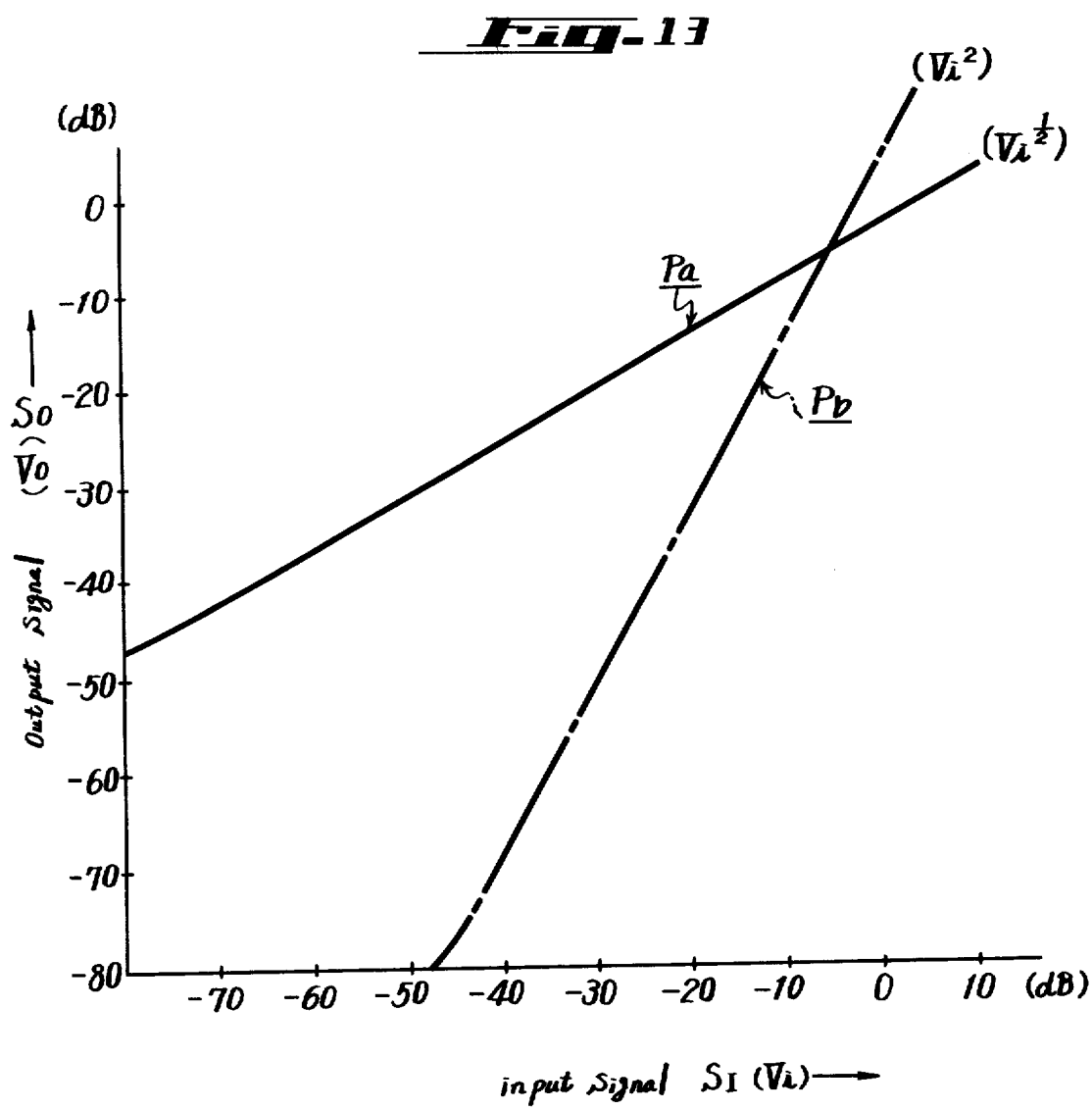

SIGNAL COMPRESSION/EXPANSION APPARATUS

BACKGROUND OF THE INVENTION

This invention relates to signal compression/expansion apparatus and, more particularly, to such apparatus wherein an input signal is compressed by an exponential factor in the signal compression apparatus; and is expanded by a reciprocal of that exponential factor in the signal expansion apparatus.

In information signal recording, such as in the recording of an audio signal on a recording medium, for example, on a magnetic tape, sheet or disc, or on a record disc, it often is desirable to minimize or effectively eliminate noise. Typically, this noise appears as background noise or hiss. Accordingly, various noise eliminating circuits have been proposed. In a typical noise eliminating circuit now used, the dynamic range of the information signal is narrowed, or reduced, prior to recording, and this range is restored to its original value during reproduction.

In a noise eliminating circuit of the so-called dbx-system, the information signal is compressed by a fractional exponential factor prior to recording and then, during reproduction, the signal is expanded by the reciprocal of that exponential factor. In one embodiment of such a dbx-system, the signal compressing circuitry includes an exponential amplifier, that is, an amplifier whose gain is equal to an exponential function, and also a logarithmic conversion circuit for producing a gain control voltage that is a logarithmic function. The signal expanding circuitry used in the dbx-system also includes an exponential amplifier and a logarithmic conversion circuit.

While the theoretical operation of such a dbx-system may be acceptable, the actual operation of such a dbx-system may be acceptable, the actual operation thereof is less than satisfactory. In particular, exponential amplifiers and logarithmic conversion circuits are complex and, therefore, are expensive to manufacture. Also, it often is difficult to manufacture matched exponential amplifiers which are necessary to achieve signal expansion that is the correct reciprocal of the signal compression. Furthermore, since the circuit components which are used are subjected to a range of tolerances, the difficulty of assembling matched compression and expansion circuits is further increased. Additionally, because of temperature dependencies inherent in many circuit components, even matched circuits may exhibit nonuniform characteristics over a period of time.

OBJECTS OF THE INVENTION

Therefore, it is an object of the invention to provide improved apparatus for the compression/expansion of an input signal which substantially avoids the foregoing disadvantages of the prior art.

Another object of this invention is to provide signal compression apparatus for compressing an input signal by a fractional exponential factor.

A further object of this invention is to provide signal expansion apparatus for expanding a signal by an exponential factor that is the reciprocal of a compression factor.

Yet another object of this invention is to provide improved signal compression/expansion apparatus including matched signal compressing and expanding circuits that exhibit substantially uniform characteristics over a relatively long period of time.

An additional object of this invention is to provide improved signal compressing and expanding circuits wherein linear amplifiers are used to achieve compression and expansion by an exponential factor.

Various other objects, advantages and features of the present invention will become readily apparent from the ensuing detailed description, and the novel features will be particularly pointed out in the appended claims.

SUMMARY OF THE INVENTION

In accordance with the present invention, signal compression/expansion apparatus is provided, including a signal compressing circuit comprised of a plurality of serially-connected voltage controlled amplifiers, a first of such voltage controlled amplifiers being supplied with an input signal to be compressed and an intermediate one of such amplifiers producing an exponentially compressed output signal; the last of the voltage controlled amplifiers being coupled to a control signal generator which produces a control voltage as a function of the output of said last voltage controlled amplifier and a reference voltage, the control voltage being supplied to all of the voltage controlled amplifiers in the signal compressing circuit; and further including a signal expanding circuit comprised of a plurality of voltage controlled amplifiers wherein predetermined first and second voltage controlled amplifiers are supplied in common with an input signal to be expanded, the output of one of such voltage controlled amplifiers producing an output signal expanded by an exponental factor; the output of at least the other voltage controlled amplifier being coupled to a control signal generator which produces a control voltage as a function of the output of such voltage controlled amplifier and a reference signal, this control voltage being suplied to all of the voltage controlled amplifiers included in the signal expanding circuit.

BRIEF DESCRIPTION OF THE DRAWINGS

The following detailed description, given by way of example, will best be understood in conjunction with the accompanying drawings in which:

FIG. 1 is a block diagram of a prior art noise eliminating circuit;

FIGS. 2A and 2B are block diagrams showing signal compressing and expanding circuits, respecively, used in the noise eliminating circuit of FIG. 1;

FIG. 3 is a block diagram of one embodiment of a signal compressing circuit in accordance with the present invention;

FIG. 11 is a block diagram of another embodiment of a signal compressing circuit in accordance with the teachings of the present invention;

FIG. 12 is a block diagram of another embodiment of a signal expanding circuit in accordance with the teachings of the present invention; and FIG. 13 is a graphical representation showing the signals produced by the compressing and expanding circuits of the present invention.

DETAILED DESCRIPTION OF SOME OF THE PREFERRED EMBODIMENTS

Figure 4:
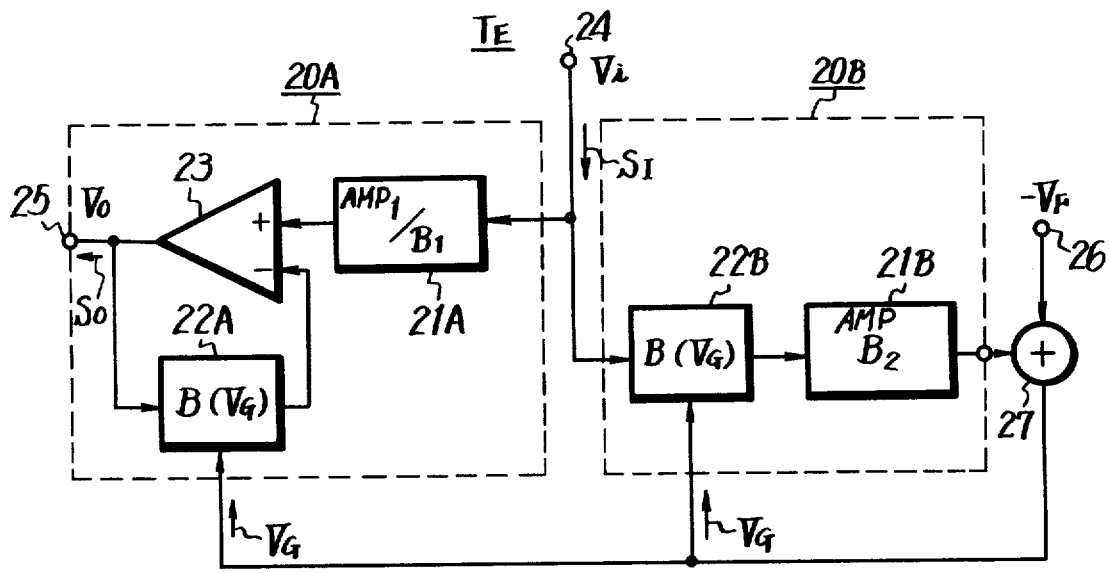
FIG. 4 is a block diagram of one embodiment of a signal expanding circuit in accordance with the present invention.

A proper appreciation of the present invention will best be understood by first considering the construction and operation of a typical prior art noise eliminating circuit. One such circuit is depicted in the block diagram shown in FIG. 1. As discussed above, a typical use of a noise eliminating circuit is to eliminate noise accompanying an information signal to be recorded on a recording medium. In the embodiment of the prior art circuit shown in FIG. 1, noise elimination is achieved by signal compression. Accordingly, a signal compressing circuit 1 is adapted to receive an input information signal applied to terminal 6a and to compress this signal by an exponential factor for recording on recording medium 2. The compressed signal is derived from compressing circuit 1 at terminal 6b. During signal playback, it is necessary to restore the recorded information signal to its original cnfiguration. Accordingly, a matched expanding circuit 3 is connected to receive the reproduced information signal from recordng medium 2 and supplied via terminal 3a. The signal produced by expanding circuit 3 is provided at terminal 3b, this signal being expanded by an exponential factor that is the reciprocal of the compression factor of compressing circuit 1.

Compressing circuit 1 of FIG. 1 is shown in greater detail as the signal compressing circuit 10A shown in FIG. 2A. An input signal Si, having an input voltage level Vi, is supplied to input terminal 6a and is transmitted in common to a voltage controlled exponential amplifier 4 and a logarithmic conversion circuit 5. Exponential amplifiers are known in the art and amplifier 4 is provided with a gain A that may be expressed as $A = A_o \exp C_1 V_c$, wherein $C_1$ is a constant and $V_c$ is a control voltage supplied thereto by logarithmic conversion circuit 5. The control voltage $V_c$ produced by logarithmic conversion circuit 5 is adapted to be logarithmically related to the input voltage Vi. Accordingly, the control voltage $V_c$ can be expressed as: $V_c = 1/C_2 \times \ln k \, Vi$, wherein $C_2$ and k are constants and Vi is the voltage level of input signal Si.

Accordingly, in this signal compressing circuit shown in FIG. 2A, the voltage level Vo of the output signal So produced by exponential amplifier 4 and provided at terminal 6b can be expressed as:

$$V_o = A_0 k^{(c_1/c_2)} V_i^{1+(c_1/c_2)} \quad (1)$$

A typical exponential compressing factor is $\frac{1}{2}$. Accordingly, if $C_2 = -2C_1$, then equation (1) can be rewritten as:

$$V_o = A_0 k^{(-1/2)} V_i^{(1/2)} \quad (2)$$

In the signal compressing circuit of FIG. 2A, if it is assumed that $C_2$ equals $C_1$ in equation (1), then the output voltage level Vo may be expressed as:

$$V_o = A_0 k \, V_i^2 \quad (3)$$

Equation (3) represents that input signal Si is expanded by the exponential factor 2. Thus, depending upon the particular selection of constants $C_2$ and $C_1$, circuit 10A can function either as a signal compressing circuit or a signal expanding circuit.

An embodiment of signal expanding circuit 3 is shown in greater detail in FIG. 2B as expander 10B. An input signal having voltage level Vi is applied to a voltage controlled exponential amplifier 4 connected to terminal 3a. The output voltage Vo produced by exponential amplifier 4 is fed back through logarithmic conversion circuit 5 as a control voltage Vc. Amplifier 4 and conversion circuit 5 shown in FIG. 2B may be similar to amplifier 4 and conversion circuit 5 shown in FIG. 2A. Hence, the gain of amplifier 4 is the same as that described above, and the mathematic operation of conversion circuit 5 also is the same as described hereinabove. Accordingly, the output voltage Vo produced at terminal 3b by expander 10B can be expressed as:

$$V_o^{1-(c_1/c_2)} = A_0 k^{(c_1/c_2)} V_i \quad (4)$$

Preferably, expander 10B is matched to compressor 10A. Accordingly, if the signal compression is the exponential factor $\frac{1}{2}$, then the signal expansion should be the reciprocal of the compression, that is, signal expansion should be the exponential factor 2. This is achieved if $C_2$ equals $2C_1$ in equation (4), resulting in:

$$V_o = A_0^2 k \, V_i^2 \quad (5)$$

If it is assumed that, in equation (4), $C_2$ equals $-C_1$, then equation (4) can be rewritten as:

$$V_o = A_0^{(1/2)} k^{-(1/2)} V_i^{(1/2)} \quad (6)$$

Equation (6) represents that the signal expanding circuit may function as a compression circuit if the constants $C_2$ and $C_1$ are properly selected. Hence, both the signal compressing circuit shown in FIG. 2A and the signal expanding circuit shown in FIG. 2B can be used either as signal compressing circuits or signal expanding circuits, as noted above. In general, circuits 10A and 10B are matched such that circuit 10A functions in the manner expressed as equation (2) and circuit 10B functions in the manner expressed as equation (5). Alternatively, if circuit 10A is chosen to function in the manner expressed by equation (3), then circuit 10B functions in the manner expressed as equation (6).

As mentioned above, exponential amplifiers and logarithmic conversion circuits generally are complex and, therefore, expensive to manufacture. Also, it is difficult to achieve the manufacture of matched circuits 10A and 10B. Furthermore, because of temperature dependencies and necessary tolerances of circuit components, even circuits that initially are matched ultimately may exhibit nonuniform characteristics over a period of time. Because of this, even if a signal compressing circuit 10A is constructed to have a theoretical exponential compression factor of $\frac{1}{2}$, its actual compression factor may be (1.2/2). Similarly, although the theoretical exponential expanding factor of circuit 10B may be 2, its actual expanding factor may be (2/1.2).

The present invention overcomes these shortcomings attending the use of exponential amplifiers and logarithmic conversion circuits.

Turning now to FIG. 3, there is illustrated a block diagram of one embodiment of a signal compressing circuit Tc in acordance with the teachings of the present invention. In the illustrated embodiment, an input signal is compressed by the exponential factor of 1/2. Signal compressing circuit Tc includes a pair of serially-connected voltage controlled amplifiers 7A and 7B. An input terminal 13 is connected to the first amplifier 7A and is adapted to supply an input signal Si whose voltage level Vi is to be compressed. An output terminal 14 is connected to a predetermined connection point between the adjacent amplifiers 7A and 7B and is adapted to provide an output signal So whose voltage level Vo is compressed.

Voltage controlled amplifier 7A is comprised of a variable gain controlled element, such as a voltage controlled variable impedance 8A whose gain (or attenuation factor) can be expressed as $A(V_G)$. Variable impedance 8A, described in greater detail below, is connected in series with an amplifier 9A of substantially constant, predetermined gain. In one embodiment, amplifier 9A is a unity gain amplifier.

The gain $A(V_G)$ of gain controlled element 8A is a function of a control voltage $V_G$ applied thereto. The gain of amplifier 9A may be expressed as $A_1$.

Voltage controlled amplifier 7B is similar to just-described amplifier 7A and is comprised of a gain controlled element 8B connected in cascade with an amplifier 9B having a substantially constant, predetermined gain. The gain of gain controlled element 8B is a function of control voltage $V_G$ and may be expressed as $B(V_G)$, this gain preferably being less than unity. The gain of amplifier 9B may be expressed as $A_2$.

Control voltage $V_G$ is a function of the output voltage $V_B$ produced by the last of the series-connected voltage controlled amplifiers 7B and a reference voltage $V_F$. Accordingly, a control voltage generator 11, which may comprise a summing circuit, has one input connected to the output of voltage controlled amplifier 7B and another input connected to a terminal 12, this terminal being adapted to receive a reference voltage, such as a negative offset voltage $-V_F$. Summing circuit 11 is described in greater detail below.

In a preferred embodiment of signal compressing circuit Tc shown in FIG. 3, the gain of gain controlled element 8A is equal to the gain of gain controlled element 8B. Accordingly, $A(V_G) = B(V_G)$. This can be attained by constructing gain controlled elements 8A and 8B in integrated circuit configuration, preferably on the same semiconductor chip. Hence, these elements will exhibit substantially identical characteristics over long periods of time.

A mathematical analysis of the embodiment shown in FIG. 3 results in the relationship between the input voltage level Vi of input signal Si and the output voltage level Vo of output signal So as follows:

$$V_F A_1 \cdot A(V_G) = V_O \qquad (7)$$

Similarly, the relationship between the voltage level Vo applied to voltage controlled amplifier 7B and control voltage $V_G$ produced by summing the circuit 11 can be expressed as:

$$V_O A_2 A(V_G) = V_G + V_F \qquad (8)$$

Equations (7) and (8) can be combined to cancel the factor $A(V_G)$, resulting in:

$$V_O = (V_G + V_F)^{1/2} (A_1/A_2)^{1/2} (Vi)^{1/2} \qquad (9)$$

From equation (9) it is apparent that circuit Tc functions as a signal compressing circuit having an exponential signal compression factor of ½. An advantage of this illustrated embodiment is that none of the amplifiers or gain controlled elements is an exponential amplifier or a logarithemic conversion circuit, as discussed above in respect to FIG. 2A. Thus, the FIG. 3 embodiment is relatively simple to construct, may be formed as an integrated circuit and, therefore, is substantially les expensive than the previously described prior art embodiments. Even though circuit components 8A, 9A, 8B and 9B may exhibit linear characteristics, nevertheless, the illustrated interconnections comprising circuit Tc result in an exponential signal compressing factor. Furthermore, because circuit Tc is formed as an integrated circuit, the respective gain controlled elements exhibit uniform characteristics and remain matched over long periods of time. Furthermore, the illustrated circuit components exhibit favorable temperature characteristics. Also, as should be apparent from equation (9), except for the factor Vi, this equation does not include additional variable factors that are dependent upon the tolerances of the respective circuit elements. Hence, the signal compressing factor of circuit Tc is substantially uniform for all manufactured circuits.

In some instances, the factor $(V_G + V_F)$ in equation (9) may not be constant for all input signals. This can be overcome by increasing the offset voltage $V_F$ such that the factor $(V_G + V_F)^{1/2}$ will remain substantially constant. Accordingly, offset voltage $V_F$ preferably is a predetermined voltage level.

In a typical application of circuit Tc, input signal Si is compressed and then recorded on a suitable recording medium. During playback, it generally is desired to expand this compressed signal to restore it to its original levels. A preferred embodiment of a signal expanding circuit Te is shown in FIG. 4. Voltage controlled amplifiers 20A and 20B have common-connected inputs that are coupled to an input terminal 24 so as to receive an input signal Si having an input voltage level Vi. It may be appreciated that, when used as a signal expanding circuit, input terminal 24 of circuit Te is supplied with a compressed signal. Voltage controlled amplifier 20A is coupled to an output terminal 25 to produce an output signal So whose voltage level Vo is expanded. Voltage controlled amplifier 20B is coupled to a control signal generator 27 for producing a control voltage $V_G$ that is supplied to each of the voltage controlled amplifiers to correspondingly determine their respective gains.

If it is assumed that expanding circuit Te is to expand a signal that previously had been compressed by compressing circuit Tc, then, in accordance with the previously assumed numerical example, expanding circuit Te has an exponential signal expanding factor of 2. Voltage controlled amplifier 20A may be comprised of a gain controlled element, such as a voltage controlled impedance, connected in series with an amplifier having a substantially constant, predetermined gain. In such a circuit arrangement, it is preferred that both the gain controlled element and constant gain amplifier have respective gains that are less than unity. Hence, the constant gain amplifier may be considered as a substantially constant attenuator. In another embodiment, such as shown in FIG. 4, voltage controlled amplifier 20A is comprised of an attenuator 21A, or amplifier whose gain is less than unity, adapted to receive input signal Si and, after attenuation, supplying the attenuated input signal to one input of an operational amplifier 23. Operational amplifier 23 could be of the conventional type having non-inverting and inverting inputs. As shown in FIG. 4, the non-inverting input is connected to attenuator 21A and the inverting input is connected to the amplifier output via a feedback circuit formed of gain controlled element 22A. Gain controlled element 22A may be similar to previously described gain controlled element 8A and, therefore, may comprise a voltage controlled impedance having a transfer function, or gain, $B(V_G)$ determined by control voltage $V_G$.

Voltage controlled amplifier 20B is comprised of a gain controlled element 22B, such as a voltage controlled impedance, connected in cascade with an amplifier 21B of substantially constant, predetermined gain $B_2$. Voltage controlled impedance 22B may be similar to voltage controlled impedance 22A and includes a transfer function, or gain, $B(V_G)$.

Signal generator 27 may be similar to previously described signal generator 11 (shown in FIG. 3) and, therefore, may comprise a summing circuit having one input coupled to the output of voltage controlled amplifier 20B and another input coupled to the terminal 26 and adapted to receive a reference voltage, such as a negative offset voltage $-V_F$. Hence, control voltage $V_G$ is the summation of offset voltage $-V_F$ and the output voltage produced by voltage controlled amplifier 20B.

A mathematical analysis of voltage controlled amplifier 20B results in the expression:

$$ViB_2B(V_G) = V_G + V_F \quad (10)$$

Likewise, a mathematical analysis of voltage controlled amplifier 20A results in the expression:

$$Vo = Vi \, 1/B_1 \cdot 1/B(V_G) \quad (11)$$

Equations (10) and (11) can be combined to eliminate the factor $B(V_G)$, resulting in:

$$Vo = (B_2/B_1) \cdot (1/V_G + V_F) \, Vi^2 \quad (12)$$

It is seen from equation (11) that voltage controlled amplifier 20A may be formed of different circuit components. For example, as mentioned hereinabove, an amplifier (or attenuator) having a gain $1/B_1$ and a voltage controlled impedance having a transfer function, or gain, $1/B(V_G)$ can be connected in cascade to result in equation (11). However, the illustrated embodiment of voltage controlled amplifier 20A is preferred because the gain of gain controlled element 22A can be made equal to the gain of gain controlled element 22B, thereby providing for uniform characteristics.

In the embodiment shown in FIG. 4, none of the amplifiers, attenuators or gain controlled elements is an exponential amplifier or logarithmic conversion circuit. Rather, the illustrated circuit components exhibit substantially linear gain (or attenuation) characteristics. Nevertheless, because of the illustrated interconnections, expanding circuit Te is capable of providing an exponential signal expansion factor of 2. Also, the respective amplifiers can be matched and, because the amplifiers may be constructed of integrated circuit configuration, they exhibit substantially uniform characteristics over long periods of time and favorable temperature characteristics. Furthermore, the exponential expansion factor is not significantly affected by different values of electronic component elements due to, for example, the lower range of tolerances of such elements. Therefore, when compressing circuit Tc is used in combination with expanding circuit Te, undesired noise accompanying an information signal is substantially eliminated.

If the exponential signal compression factor of circuit Tc is, for example, ½, then gain controlled elements 8A and 8B (and also elements 22A and 22B in expanding circuit Te) must provide this exponential factor over a wide range of input signal levels. For example, if the input signal is capable of varying over a range of 120db, then the gain controlled elements must provide the necessary gain over a range of at least 60db. One example of a satisfactory gain controlled element which can be used in the compressing circuit Tc and the expanding circuit Te is a field effect transistor (FET) of the type having two drain electrodes connected at opposite ends of the drain region and spaced apart in the direction of the channel width. Such an FET, proposed by the instant inventor, has a favorable attenuation characteristic that is substantially constant over a wide range of input signal level.

Figure 5:
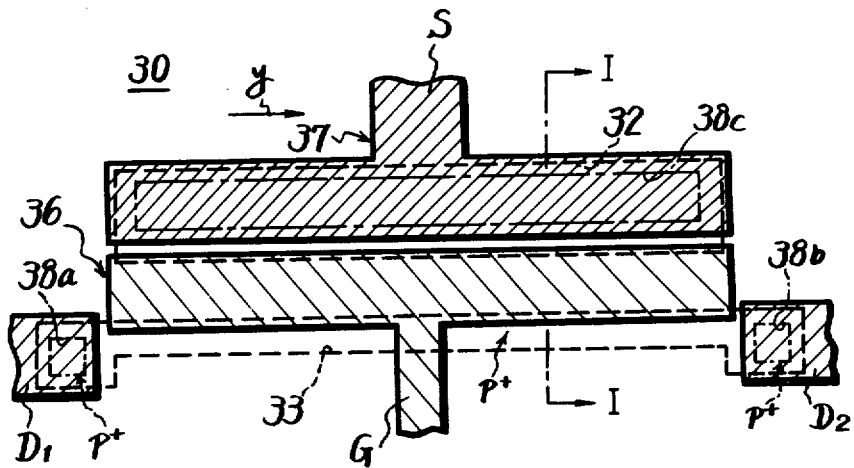
FIG. 5 is a plan view of one embodiment of an FET which can be used with the present invention.
Figure 6:
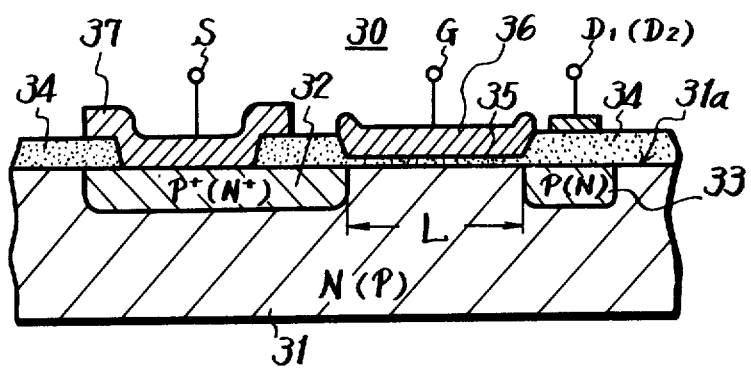
FIG. 6 is a sectional view of the FET shown in FIG. 5.

A preferred embodiment of an FET having two drain electrodes is shown in the top view of FIG. 5 and the sectional view (taken along lines I—I) of FIG. 6. This FET is of the MOS type. As shown in FIG. 6, FET 30 is comprised of a semiconductor substrate 31 having N-type conductivity. P-type impurities are diffused into the upper surface 31a of substrate 31 at spaced apart locations separated from each other by a distance L. These impurities form a diffused source region 32 and a diffused drain region 33, respectively. Preferably, drain region 33 exhibits a smaller area than source region 32. Source region 32 may include more highly doped P+ impurities than drain region 33. As shown in FIG. 5, drain electrodes $D_1$ and $D_2$ are coupled to the opposite extremities of drain region 33. The impurity concentration at these opposite extremities may be equal to or greater than the impurity concentration of the main portion of drain region 33.

An insulator layer 34, for example, $SiO_2$, or the like, and a similar insulator layer 35 are formed over upper surface 31a of substrate 31. A suitable window is etched into insulator layer 34 overlying source region 32 to permit electrical contact between a conductor 37 and the source region. A conductive layer 36, formed of aluminum, or the like, is provided on insulator layer 35 to serve as a gate region. Accordingly, a gate electrode G is coupled to conductor layer 36 and a source electrode S is coupled to conductor layer 37.

As best seen from FIG. 5, when FET 30 is turned on, a channel is provided between source region 32 and drain region 33. This channel is controlled by and is disposed beneath gate region 36. The width of the channel extends in the y direction from the left most end of source region 32 to its right most end. Drain electrodes $D_1$ and $D_2$ are coupled to the opposite extremities of drain region 33 and are seen to be spaced apart by at least the width of the channel. Thus, these drain electrodes are disposed outside of the actual channel region. Windows 38a and 38b are etched through insulator layer 34 overlying drain regions $D_1$ and $D_2$ to permit contact between the drain electrodes and drain region 33. Similarly, window 38c is etched through insulator layer 34 to permit conductor 37 to contact source region 32. These respective regions and windows are shown in broken and chain-link lines, respectively, in FIG. 5.

Figure 7:
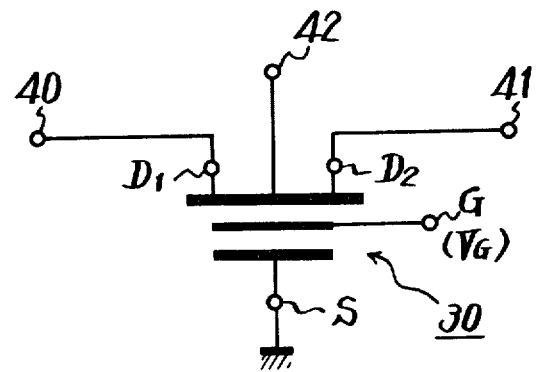
FIG. 7 is a schematic illustration of the FET shown in FIGS. 5 and 6.

A schematic representation of FET 30 is shown in FIG. 7. When used as an attenuating element, drain electrodes $D_1$ and $D_2$ may be considered as input and output electrodes, respectively, connected to input terminal 40 and output terminal 41. As an attenuator, source electrode S is coupled to ground and a suitable control voltage $V_G$ is applied to gate electrode G. A back gate terminal 42 also is provided in FET 30.

Figure 8:
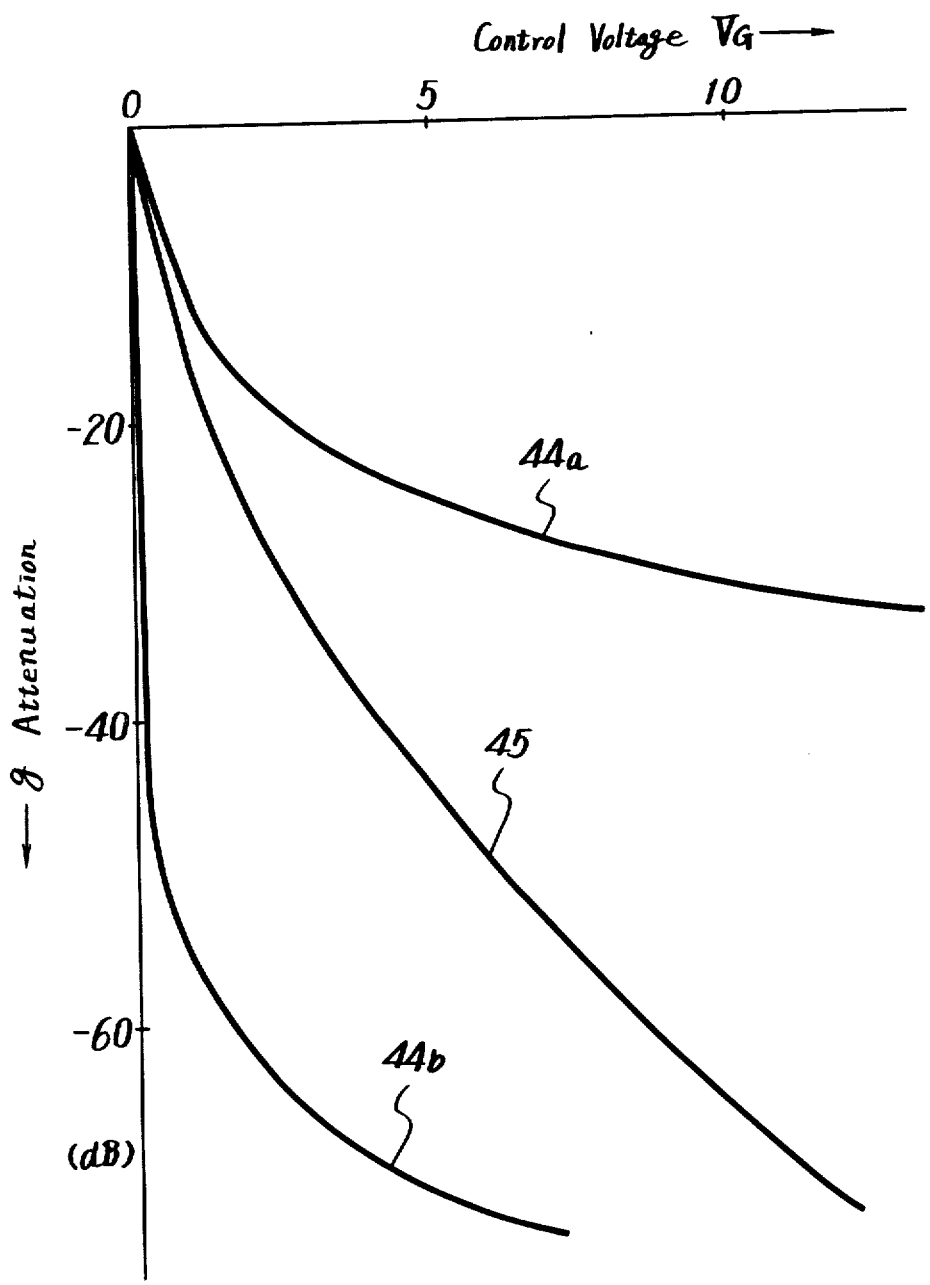
FIG. 8 is a graphical representation of the attenuating characteristic of the FET shown in FIGS. 5, 6 and 7.

The gain g, or attenuation factor, of FET 30 varies with control voltage $V_G$ in a substantially linear relationship. Thus, the attenuation factor can be increased with minimum distortion. This is achieved because FET 30 may be considered as having a lateral resistor connected between its respective drain electrodes $D_1$ and $D_2$. FET 30 may further be considered as having a group of longitudinal resistors connected between source electrode S and a predetermined point on the lateral resistor connecting the drain electrodes. Thus, the combination of one of the longitudinal resistors and a portion of the lateral resistor comprises an attenuator. The attenuators formed of the remaining longitudinal resistors are effectivelly connected in series between input and output terminals 40 and 41 so as to form a stacked attenuator. This accounts for the wide range of attenuation and linear relationship between attenuation and control voltage. This relationship is graphically depicted by a curve 45 shown in FIG. 8, this curve being shown in comparison with curves 44a and 44b which represent the attenuation characteristics of prior art voltage controlled attenuators. As may be observed from curve 45, the attenuation factor, or gain controlling factor, of FET 30 is substantially linear throughout a range of more than 60db. Consequently, FET 30 is a preferred gain control element for use in the aforedescribed gain controlled amplifiers.

Figure 9:
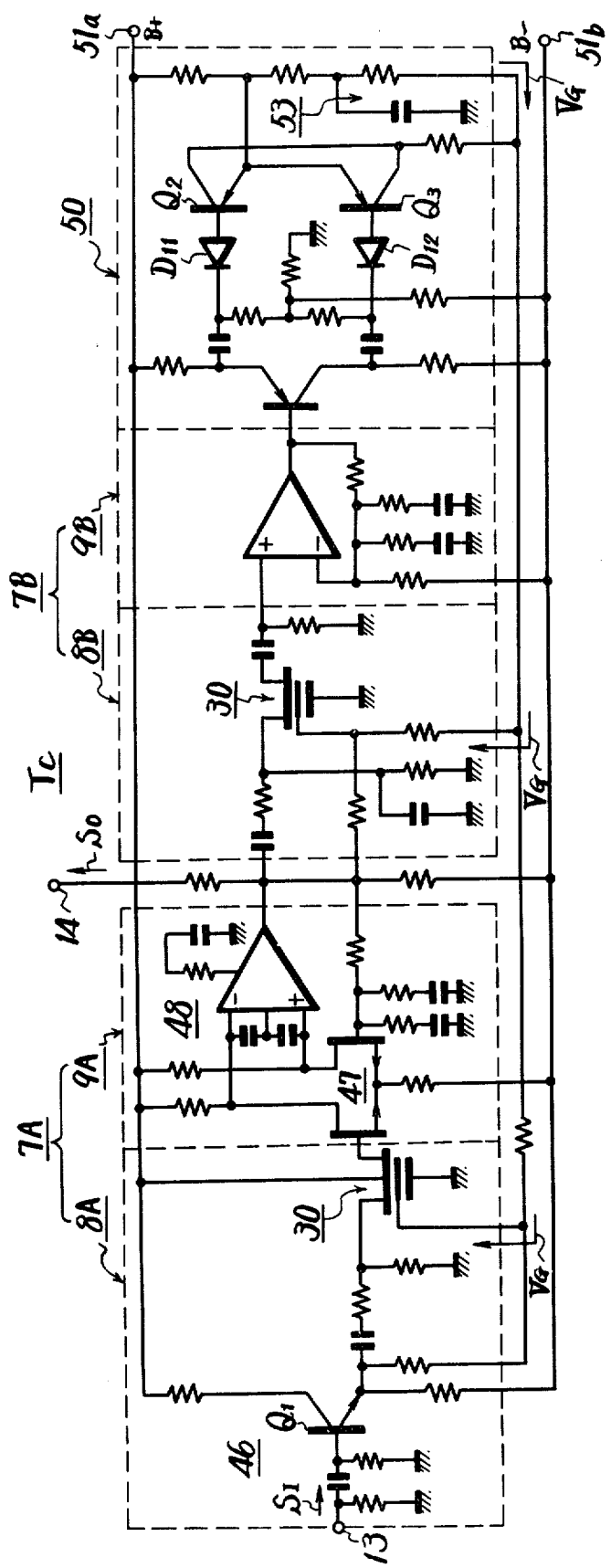
FIG. 9 is a schematic diagram of one embodiment of signal compressing circuit in accordance with the present invention.

A schematic diagram of a preferred embodiment of signal compressing circuit Tc wherein FET 30 is used as the gain controlled element is shown in FIG. 9. As depicted, gain controlled element 8A included in voltage controlled amplifier 7A comprises a buffer circuit, or impedance converter, 46 which may be an emitter-follower transistor $Q_1$. The output of this buffer circuit is connected to a first drain electrode of FET 30, the other drain electrode of the FET being connected to constant gain amplifier 9A. The constant gain amplifier includes an operational amplifier 48 having a pair of inputs, such as an inverting input and a non-inverting input, and a differential amplifier 47 having a pair of outputs connected, respectively, to the inverting and non-inverting inputs of operational amplifier 48. Thus, FET 30 is coupled through differential amplifier 47 to the non-inverting input of operational amplifier 48. The output of this operational amplifier is fed back through differential amplifier 47 to the inverting input thereof.

Voltage controlled amplifier 7B is substantially similar to voltage controlled amplifier 7A except that FET 30 included in gain controlled element 8B is coupled to the output of operational amplifier 48 of constant gain amplifier 9A in the absence of an intermediary buffer circuit.

The output of constant gain amplifier 9B is coupled to a control voltage generator 50 which includes a full-wave rectifier circuit. Thus, the output of amplifier 9B is phase-split and then coupled through diodes $D_{11}$ and $D_{12}$ to transistors $Q_2$ and $Q_3$, as shown. The rectified output derived from transistors $Q_2$ and $Q_3$ is combined with offset voltage $V_F$, this offset voltage being equal to the base-emitter voltage $V_{be}$ of transistors $Q_2$ and $Q_3$ and the threshold voltage $V_{th}$ of FET 30. The combined, or added voltages are supplied through a time constant circuit 53 to the respective gate electrodes of FET's 30 as control voltage $V_G$. This control voltage also is applied to the emitter of buffer circuit transistor $Q_1$. As also shown in FIG. 9, suitable operating potentials B+ and B− are supplied to the respective circuit components via power supply terminals 51a and 51b.

Signal compressing circuit Tc produces an output signal So at output terminal 14 that is compressed with respect to input signal Si applied to input terminal 13 by the exponential factor 1/2. This signal compression ratio is substantially linear over a wide range of input signal level, as shown by curve Pa graphically depicted in FIG. 13.

Figure 10:
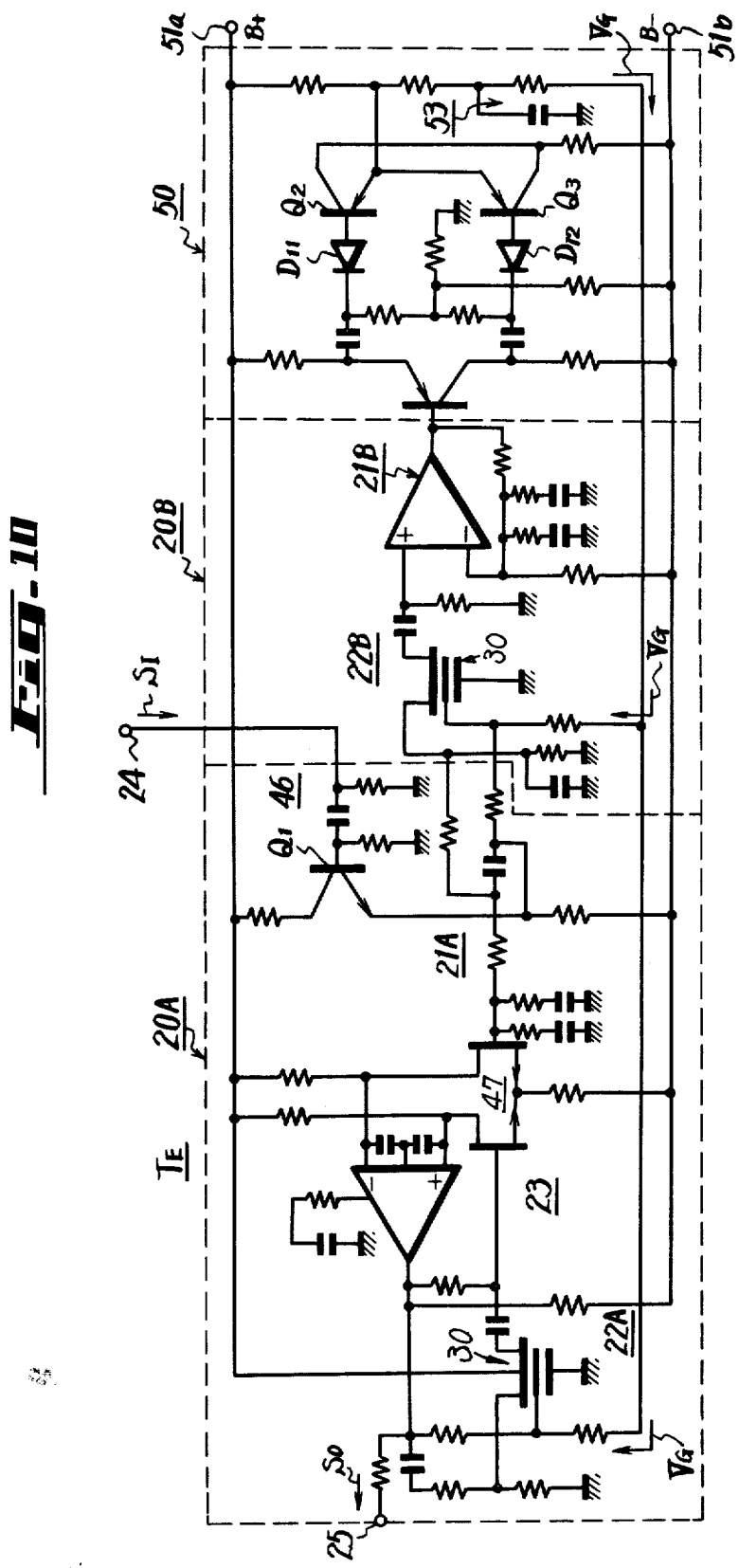
FIG. 10 is schematic diagram of one embodiment of a signal expanding circuit in accordance with the present invention.

A schematic diagram of signal expanding circuit Te is shown in FIG. 10. Voltage controlled amplifier 20A includes a buffer circuit 46 including emitter-follower transistor $Q_1$, similar to buffer circuit 46 shown in FIG. 9. The output of this buffer circuit is connected through attenuator 21A and differential amplifier 47 to the non-inverting input of operational amplifier 23. Gain controlled element 22A includes FET 30 and is connected in feedback relation between the output of operational amplifier 23 and, through differential amplifier 47, to the inverting input of the operational amplifier. Thus, it is seen that voltage controlled amplifier 20A of signal expanding circuit Te is similar to voltage controlled amplifier 7A of signal compressing circuit Tc. That is, both amplifiers include an operational amplifier having a pair of inputs coupled to a pair of outputs of a differential amplifier. Also, both amplifiers include an input buffer circuit. The difference between these respective amplifiers is that in signal compressing circuit Tc, input signal Si is supplied through FET 30 and then through differential amplifier 47 to operational amplifier 48; however, in signal expanding circuit Te, it is the output of the operational amplifier that is fed back via FET 30.

Voltage controlled amplifier 20B of FIG. 10 is seen to be substantially similar to voltage controlled amplifier 7B in FIG. 9; and control voltage generator 50 in FIG. 10 also is similar to control voltage generator 50 in FIG. 9. Accordingly, in the interest of brevity, further description of signal expanding circuit Te is not provided.

Suffice it to say, however, signal expanding circuit Te shown in FIG. 10 is capable of expanding the input signal Si supplied thereto by the exponential factor 2. This signal expanding characteristic is depicted by curve Pb shown in FIG. 13. It is appreciated that a substantially linear signal expansion charcteristic is exhibited by signal expanding circuit Te over a relatively wide range.

While the exponential signal compression factor of compressing circuit Tc has been described as being equal to ½; and while the exponential expansion factor of signal expanding circuit Te has been described as equal to 2, the teachings of the present invention need not be limited solely to these factors. Rather, the present invention can be used to achieve an exponential compression factor of $n-k/n$; and an exponential expansion factor of $n/n-k$, when n and k are integers. In the above-described examples, these integers have been selected as $n = 2$ and $k = 1$. A more generalized embodiment of signal compressing circuit Tc in accordance with the teachings of the present invention is shown in FIG. 11 wherein $n$ serially-connected voltage controlled amplifiers 7A, 7B . . . 7K, . . . 7N are shown. Each of these voltages controlled amplifiers may be of similar construction shown, for example, in the schematic diagram of FIG. 9. Accordingly, each voltage controlled amplifier stage is comprised of a gain controlled element, or voltage controlled impedance, 8A, 8B . . . 8K . . . 8N, connected in cacade with an associated substantially constant gain amplifier 9A, 9B . . . 9K, . . . 9N, respectively. Input terminal 13 is connected to the first stage 7A and output terminal 14 is coupled to the output of a predetermined stage 7K. That is, output terminal 14 is connected to a connection point between selected adjacent stages 7K and 7(K+1). In the generalized embodiment shown in FIG. 11, the compressed voltage output level derived from the kth stage 7K is $V_{ok}$, which may be expressed as:

$$V_{ok} = \frac{(A_1 \cdot A_2 \cdots A_k)^{\frac{n-k}{n}}}{(A_{k+1} \cdot A_{k+2} \cdots A_n)^{\frac{k}{n}}} \cdot (V_G + V_F)^{\frac{k}{n}} V_i^{\frac{n-k}{n}} \quad (13)$$

The factors $A_1, A_2, \ldots A_k, A_{k+1}, \ldots A_n$ are the respective gains of the substantially constant gain amplifiers 9A . . . 9N. Equation (13) represents that the voltage level Vi of input signal Si is compressed by the exponential factor $n-k/n$. As may be appreciated, depending upon the particular connection of output terminal 14 to any one of the n voltage controlled amplifiers, the factor k is correspondingly adjustable so as to vary the exponential compression factor.

An embodiment of a generalized signal expanding circuit Te is shown in FIG. 12. This illustrated embodiment may be considered to be formed of two groups of voltage controlled amplifiers; that is, a first group comprised of k voltage controlled amplifiers 20A, 20B, . . . 20K, and a second group of n-k voltage controlled amplifiers 20(K+1), . . . 20 N. Input terminal 24 is connected in common to both groups of voltage controlled amplifiers. In particular, input terminal 24 is connected to the kth voltage controlled amplifier 20K and also to the (k+1)th voltage controlled amplifier 20(K+1). The kth voltage controlled amplifier stage 20K may be constructed as a voltage controlled amplifier in accordance with amplifier 20A shown in FIG. 4, while the remaining voltage controlled amplifier stages of FIG. 12 may be constructed as voltage controlled amplifier 20B shown in FIG. 4. Hence the output of operational amplifier 23 included in the kth stage 20K is coupled to output terminal 25 and, additionally, is fed back through cascaded voltage controlled amplifiers 20A, 20B, . . . 20(K−1) and then through gain controlled element or voltage controlled impedance, 22K to the inverting input of operational amplifier 23.

The relation between the output voltage level Vo of output signal So and the input voltage level Vi of input signal Si in the generalized embodiment of FIG. 12 may be expressed as:

$$Vo = \frac{(B_{k+1} \cdot B_{k+2} \cdots B_n)^{\frac{k}{n-k}}}{(B_1 \cdot B_2 \cdots B_k)} \cdot \quad (14)$$

-continued
$$\frac{1}{(V_G + V_F)^{\frac{k}{n-k}}} V_i^{\frac{n}{n-k}}$$

The factors $B_1, B_2, \ldots B_k, B_{k+1}, \ldots B_n$ are the respective gains of constant gain amplifiers 21A, 21B, . . . 21K, 21(K+1) . . . 21N, respectively. If amplifier 21K has a gain less than unity so as to comprise an attenuator, then the gain of attenuator 21K may be expressed as $1/B_k$, wherein $B_k$ is greater than unity. This has been described hereinabove in respect to that embodiment of signal expanding circuit Te shown in FIG. 4.

As demonstrated by equation (14) the generalized embodiment shown in FIG. 12 exhibits an exponential expansion factor of $n/n-k$. Depending upon which voltage controlled amplifier stage the input terminal is connected, k is correspndingly varied to thereby determine the exponential expansion factor at any desired value.

In accordance with the present invention, as described above, signal compressing and expanding circuits may be constructed without requiring the use of exponental amplifiers and logarithmic conversion circuits, as has been necessary in prior art compression and expansion circuits. Hence, substantially linear amplifiers can be used, and these amplifiers may be constructed of integrated circuit configuration. Consequently, various circuit components and elements may be formed on the same semiconductor chip, thereby offering the advantage of matched compression and expansion circuits exhibiting substantially uniform characteristics over a wide range of input signals. Furthermore, because the compression and expansion circits may be formed of integrated circuits, the particular characteristics thereof, and especially the voltage controlled parameters, are relatively insensitive to temperature and are not subjected to changing parameters due to the range of tolerances of the individual circuit components.

While the present invention has been particularly shown and described with reference to certain preferred embodiments, it should be readily apparent that various changes and modifications in form and details may be made without departing from the spirit and scope of the invention. Accordingly, it is intended that the appended claims be interpreted as including all such changes and modifications.

What is claimed is:

1. Signal compression apparatus comprising:
   n serially-connected voltage controlled amplifier means;
   input means for supplying an input signal having a voltage $V_i$ to be compressed to a first of said $n$ voltage-controlled amplifier means;
   control signal generating means comprised of an adding circuit having one input connected to the nth of said voltage controlled amplifier means and another input connected to be supplied with a reference voltage $V_F$ for producing at an output terminal thereof a control voltage $V_G$ which is proportional to the sum of the output signal of said nth voltage controlled amplifier means and said reference voltage $V_F$;
   means for supplying said control voltage $V_G$ to each of said $n$ voltage controlled amplifier means for determining the gain thereof; and means coupled to a predetermined connection point between the $k$th and the $(k+1)$ voltage controlled amplifier means for producing an output signal having a voltage $V_o$ proportional to $(V_G+V_F)(k/n) V_i(n-k)/n$.

2. Signal compression apparatus according to claim 1, in which each of said voltage controlled amplifier means comprises a voltage controlled variable impedance means supplied with said control voltage and an amplifier connected in cascade with said variable impedance means.

3. Signal compression apparatus according to claim 2, wherein said reference voltage $V_F$ is an offset voltage.

4. Signal compression apparatus according to claim 3, in which the output voltage $V_o$ is related to the input voltage $V_i$ in accordance with the equation, $$V_o = \frac{(A_1 \cdot A_2 \ldots A_k)^{\frac{n-k}{n}}}{(A_{k+1} \cdot A_{k+2} \ldots A_n)^{\frac{k}{n}}} \cdot (V_G + V_F)^{\frac{k}{n}} \cdot V_i^{\frac{n-k}{n}}$$

wherein said means for producing an output signal is coupled between the $k$th and the $(k + 1)$th voltage controlled amplifier means, and $A_1$ through $A_n$ are gains of the respective amplifiers connected in cascade with corresponding variable impedance means.

5. Signal compression apparatus according to claim 4, wherein the connection of said output means is variable to thereby vary $k$ in order to deterine the exponential compression characteristics of said output signal.

6. Signal compression apparatus according to claim 5, in which said voltage controlled variable impedance means includes an FET comprised of:
a semiconductor substrate of one conductivity type;
a source region of opposite conductivity type and a drain region of opposite conductivity type, the source and drain regions both extending into said substrate from one surface thereof;
a channel region formed between said surce and drain regions through which a channel current flows, each of said drain and source regions having substantially parallel boundaries facing each other across said channel region;
first and second drain electrodes electrically connected to opposite transversely separated ends of said drain region, said drain region having a resistance between said ends which is higher than the resistance between the ends of said source region;
an insulating layer overlying said channel region;
a gate region formed on said insulating layer;
a gate electrode electrically connected to said gate region; and
a source electrode electrically connected to said source region;
said first and second drain electrodes being connected in series with the input of its associated, cascaded amplifier, said source electrode being connected to a voltage reference point and said gate electrode being supplied with said control voltage.

7. Signal compression apparatus accordig to claim 6, further including an emitter follower amplifying stage connected to the input of the FET in at least the first voltage controlled amplifier means.

8. Signal compression apparatus, comprising:
n serially-connected voltage controlled amplifier means, each including a voltage controlled variable impedance and a cascade-connected amplifier, at least one of the cascade-connected amplifiers being comprised of a differential amplifier having a pair of outputs and an operational amplifier having a pair of inputs connected to the pair of outputs of said differential amplifier, said voltage controlled variable impedance being coupled to an input of said differential amplifier;
input means for supplying an input signal to be compressed to a first of said n voltage controlled amplifier means;
control signal generating means comprised of an adding circuit having one input connected to the nth of said voltage controlled amplifier means and another input connected to be supplied with a reference voltage for producing at an output terminal thereof a control voltage which is proportional to the sum of the output signal of said nth voltage controlled amplifier means and said reference voltage;
means for supplying said control voltage to the voltage controlled variable impedance in each of said voltage controlled amplifier means; and
means coupled to a predetermined connection point between adjacent voltage controlled amplifier means for producing an exponentially compressed output signal.

9. Signal compression apparatus according to claim 28, in which said control signal generating means is further comprised of a full-wave rectifier formed of a pair of transistors for receiving the output signal of said nth voltage controlled amplifier means.

10. Signal expansion apparatus comprising:
$n$ voltage controlled amplifier means arranged in two groups, one of said groups comprised of $k$ serially-connected voltage controlled amplifier means and the other of said groups comprised of $n-k$ serially-connected voltage controlled amplifier means;
input means for supplying an input signal having a voltage $V_i$ to a common connection point between said two groups of voltage controlled amplifier means;
control signal generating means comprised of an adding circuit having one input connected to the output of the nth voltage controlled amplifier means in said group of $n-k$ voltage controlled amplifier means and another input connected to be supplied with a reference voltage $V_F$ for providing at an output terminal thereof a control voltage $V_G$ which is proportional to the sum of the output signal of said nth voltage controlled amplifier means and said reference voltage $V_F$;
means for supplying said control voltage $V_G$ to each of said n voltage controlled amplifier means for determining the gain thereof; and
output means coupled to said group of k voltage controlled amplifier means for producing an expanded output signal having a voltage $V_o$ proportional to $$\frac{V_i^{\frac{n}{n-k}}}{(V_G + V_F)^{\frac{k}{n-k}}}.$$

11. Signal expansion apparatus according to claim 10, in which at least one of said voltage controlled amplifier means included in said group of $k$ voltage controlled amplifier means comprises a voltage controlled impedance means and an attenuator connected in series; and each of said voltage controlled amplifier means included in said group of $n-k$ voltage controlled amplifier means comprises voltage controlled impedance means connected in cascade with an amplifier.

12. Signal expansion apparatus according to claim 11 wherein said reference voltage $V_F$ is an offset voltage.

13. Signal expansion apparatus according to claim 12, in which said expanded output voltage ($V_o$) is related to said input voltage ($V_i$) in accordance with the equation:

$$V_o = \frac{(B_{k+1} \cdot B_{k+2} \ldots B_n)^{\frac{k}{n-k}}}{(B_1 \cdot B_2 \ldots B_k)} \cdot \frac{1}{(V_G + V_F)^{\frac{k}{n-k}}} \cdot V_i^{\frac{n}{n-k}}$$

wherein said means for producing an output signal is coupled to the $k$th voltage controlled amplifier means, said input means is coupled to the $k$th voltage controlled amplifier means, the first through $(k-1)$th voltage controlled amplifier means are connected in feedback relation from the output to the input of said $k$th voltage controlled amlifier means, and $B_1$ through $B_n$ are the gains of the respective amplifiers connected in cascade with a corresponding voltage controlled impedance means.

14. Signal expansion apparatus according to claim 13, wherein the particular location of the $k$th voltage controlled amplifier means is variable to thereby vary $k$ in order to determine the exponential expanding characteristics of said output signal.

15. Signal expansion apparatus according to claim 14, in which said $k$th voltage controlled amplifier means comprises a differential amplifier having a pair of outputs and a pair of inputs, an operational amplifier having a pair of inputs connected to the pair of outputs of said differential amplifier, means for supplying said input signal to one of said differential amplifier inputs through said attenuator, and said voltage controlled impedance means is connected in feedback relation from the output of said operational amplifier to the other differential amplifier input; and wherein each of the remaining voltage controlled amplifier means comprises a voltage controlled impedance means connected in series with an operational amplifier; each said voltage controlled impedance means including an FET comprised of:

a semiconductor substrate of one conductivity type;

source and drain regions of opposite conductivity type, respectivly, each extending into said substrate from one surface thereof;

a channel region formed between said source and drain regions through which a channel current flows, each of said drain and source regions having edges spaced apart transversely from said channel region;

first and second drain electrodes electrically connected to said edges of said drain region, said drain region having a resistance between said edges which is higher than the resistance between the edges of said source region;

an insulating layer overlying said channel region;

a gate region formed on said insulating layer;

a gate electrode electrically connected to said gate region; and a source electrode electrically connected to said source region; said first and second drain electrodes being connected in series with the input of its associated amplifier, said source electrode being connected to a voltage reference point and said gate electrode being supplied with said control voltage.

16. Signal expansion apparatus according to claim 15, in which said attenuator in said $k$th voltage controlled amplifier means comprises an emitter follower amplifying stage and a resistive attenuator connected at the output of said emitter follower amplifying stage.

17. Signal expansion apparatus according to claim 16, in which said control signal generating means further comprises a full-wave rectifier formed of a pair of transistors for receiving the output of said nth voltage controlled amplifier means.

18. Apparatus for compressing and expanding a signal, comprising a signal compressing circuit including:

a signal input terminal for receiving an input signal to be compressed;

a signal output terminal for producing a compressed output signal;

at least two serially-connected voltage controlled amplifiers;

first circuit means for connecting said input terminal to the first one of said serially-connected voltages controlled amplifiers;

control signal generating means comprised of an adding circuit having one input connected to the last one of said serially-connected voltage controlled amplifiers and another input connected to be supplied with a reference voltage for producing at an output terminal thereof a control voltage which is proportional to the sum of the output signal of the last voltage controlled amplifier and said reference voltage;

second circuit means for supplying said control voltage to each of said serially-connected voltage controlled amplifiers; and third circuit means for connecting said signal output terminal to a predetermined connection point between corresponding voltage controlled amplifiers; and a signal expanding circuit including:

a second signal input terminal for receiving a signal to be expanded;

a second output terminal for producing an expanded output signal;

first and second voltage controlled amplifiers;

fourth circuit means for connecting said second signal input terminal to the connection point between said first and second voltage controlled amplifiers;

second control signal generating means comprised of a second adding circuit having one inut connected to the output of said second voltage controlled amplifier and another input connected to be supplied with another reference voltage for producing at an output terminal thereof a control voltage which is proportional to the sum of the output signal of said second voltage controlled amplifier and said other reference voltage;

fifth circuit means for supplying said control voltage to each of said first and second voltage controlled amplifiers; and sixth circuit means for connecting said second signal output terminal to the first voltage controlled amplifier.

19. Signal compression apparatus, comprising:

a plurality of serially-connected voltage controlled attenuators, each of said voltage controlled attenuators having a substantially linear gain characteristic over a range of at least 60dB;

input means for supplying an input signal to be compressed to a first of said voltage controlled attenuators;

a source for providing a reference signal;

control signal generating means connected to the last of said voltage controlled attenuators and to said source for combining the output of said last voltage controlled attenuator and said reference signal to produce a control voltage proportional to the sum of said output and said reference signal;

means for supplying said control voltage to each of said voltage controlled attenuators to determine the gain thereof; and output means coupled to the output of a predetermined voltage controlled attenuator for producing an output signal that is compressed with respect to said input signal by an exponential factor.

20. Signal compression apparatus according to claim 19, wherein each of said voltage controlled attenuators comprises a voltage controlled impedance whose impedance varies substantially linearly with a control voltage applied thereto and a substantially constant gain amplifier connected in cascade with said voltage controlled impedance; and wherein said output means is coupled to an intermediate one of said serially-connected voltage controlled attenuators.

21. Signal compression apparatus according to claim 20, wherein said control signal generating means comprises a summing circuit having one input connected to said last of said voltage controlled attenuators and another input connected to said source.

22. Signal compression apparatus according to claim 20, wherein each of said constant gain amplifiers is an operational amplifier having an input for receiving a signal supplied thereto by said cascade-connected voltage controlled impedance.

23. Signal expansion apparatus comprising:

at least first and second voltage controlled amplifier means, said first voltage controlled amplifier means including a first voltage controlled impedance having a substantially linear characteristic, and said second voltage controlled amplifier means including a second voltage controlled impedance having a linear characteristic connected in cascade with an amplifier of predetermined gain;

input means for supplying an input signal to be expanded in common to said first and second voltage controlled amplifier means;

a source for providing a reference signal;

control signal generating means connected to said second voltage controlled amplifier means and to said source for combining the output of said second voltage controlled amplifier means and said reference signal to produce a control voltage proportional to the sum of said output and said reference signal;

means for supplying said control voltages to each of said voltage controlled impedances to determine the respective impedance thereof; and output means coupled to the output of said first voltage controlled amplifier means for producing an output signal that is expanded with respect to said input signal by an exponential factor.

24. Signal expansion apparatus according to claim 23 wherein said first voltage controlled amplifier means further comprises an operational amplifier having a pair of inputs and an output, said output being coupled to said output means; a substantially constant gain amplifier coupled to one of said operational amplifier inputs; and said first voltage controlled impedance being connected in a feedback circuit of said operational amplifier; and wherein said input means is coupled to said substantially constant gain amplifier.

25. Signal compression apparatus according to claim 24, wherein said substantially constant gain amplifier has a gain less than unity.

26. Signal compression apparatus according to claim 25, wherein said amplifier connected in cascade with said second voltage controlled impedance in said second voltage controlled amplifier means comprises an operational amplifier having an input for receiving a signal supplied by said second voltage controlled impedance.

27. Signal compression apparatus according to claim 25, wherein said control signal generating means comprises a summing circuit having one circuit connected to the output of said second voltage controlled amplifier means and another input connected to said source.

* * * * *